United States Patent
Neumann et al.

(10) Patent No.: US 10,089,281 B1
(45) Date of Patent: Oct. 2, 2018

(54) HYBRID COMPARISON FOR UNICODE TEXT STRINGS CONSISTING PRIMARILY OF ASCII CHARACTERS

(71) Applicant: Tableau Software, Inc., Seattle, WA (US)

(72) Inventors: Thomas Neumann, Munich (DE); Viktor Leis, Munich (DE); Alfons Kemper, Munich (DE)

(73) Assignee: Tableau Software, Inc., Seattle, WA (US)

(*) Notice: Subject to any disclaimer, the term of this patent is extended or adjusted under 35 U.S.C. 154(b) by 0 days.

(21) Appl. No.: 15/719,479

(22) Filed: Sep. 28, 2017

Related U.S. Application Data

(60) Provisional application No. 62/418,246, filed on Nov. 6, 2016.

(51) Int. Cl.
  *H03M 5/00* (2006.01)
  *G06F 17/22* (2006.01)
  (Continued)

(52) U.S. Cl.
  CPC .......... *G06F 17/2217* (2013.01); *G06F 17/27* (2013.01); *H03M 7/02* (2013.01); *H03M 7/705* (2013.01)

(58) Field of Classification Search
  CPC ..... H03M 7/02; H03M 7/705; G06F 17/2217; G06F 17/27
  (Continued)

(56) References Cited

U.S. PATENT DOCUMENTS 5,948,038 A * 9/1999 Daly ........................ G08G 1/04
                                                340/933
6,195,449 B1 * 2/2001 Bogden ................... G06F 19/22
                                                382/129
(Continued)

OTHER PUBLICATIONS

Neuman, Pre-Interview First Office Action, U.S. Appl. No. 15/885,646, dated May 3, 2018, 4 pgs.

*Primary Examiner* — Lam T Mai
(74) *Attorney, Agent, or Firm* — Morgan, Lewis & Bockius LLP

(57) ABSTRACT

Comparing text strings with Unicode encoding includes receiving two text strings $S_1$ and $S_2$. The process computes, for the first text string $S_1$, a first weight according to a weight function $f$ that computes an ASCII prefix $f_A(S_1)$, computes a Unicode weight suffix $f_U(S_1)$, and concatenates the weights to form the first weight $f(S_1)=f_A(S_1)+f_U(S_1)$. Computing the ASCII prefix for the first string applies bitwise operations to n-byte contiguous blocks of the first string to determine whether each block contains only ASCII characters, and replaces accented Unicode characters with equivalent unaccented ASCII characters when comparison is designated as accent-insensitive. When there is a first block containing a non-replaceable non-ASCII character, the Unicode weight suffix is computed by performing a character-by-character Unicode weight lookup beginning with the first block. The same process is applied to the second string. The text string are compared by comparing their computed weights.

20 Claims, 14 Drawing Sheets

(51) Int. Cl.
*H03M 7/02* (2006.01)
*H03M 7/30* (2006.01)
*G06F 17/27* (2006.01)

(58) Field of Classification Search
USPC ..................................... 341/50–70
See application file for complete search history.

(56) References Cited

U.S. PATENT DOCUMENTS

| | | | |
|---|---|---|---|
| 7,519,990 B1 * | 4/2009 | Xie | H04L 63/0236 713/154 |
| 2005/0011391 A1 | 1/2005 | Jennings, III | |
| 2005/0026118 A1 | 2/2005 | Chen et al. | |
| 2005/0027547 A1 | 2/2005 | Chen et al. | |
| 2009/0106778 A1 * | 4/2009 | Pomeroy | H04L 41/12 719/328 |
| 2011/0055585 A1 | 3/2011 | Lee | |

* cited by examiner

```
static inline bool isSimpleASCIIBlock (uint64_t v)
// check if a block contains only simple characters ASCII characters
{
    // First determine if all of the bytes are ASCII characters
    bool result = !(v&mask8);

if (result) {
        // Find the positions that are >= ' ' (the 8th bit flips when adding 128-' ')
        uint64_t geSpace = (v+0x6060606060606060)&mask8;

// Find the positions that are > 126 (the 8th bit flips when adding 128-126-1)
        uint64_t gt126 = (v+0x0101010101010101(&mask8);

// Find all unsafe positions
        uint64_t unsafePos = (geSpace&(~gt126))^mask8;

// 0x00 is safe too
        uint64_t notnullPos = (v+0x7F7F7F7F7F7F7F7F)&mask8;

result = !(unsafePos¬nullPos);
    } return result;
}
```

Figure 9A

```
static inline bool blockIsASCII(uint64_t v)
{
    // check if an 8-byte block contains only ASCII characters
    return !(v&mask8);
}
```

Figure 9B

```
static inline bool asciiBlockIsSimple(uint64_t v)
{
    // check if an ASCII block contains only simple characters // Find the positions that are >= ' ' (the 8th bit flips when adding 128-' ')
    uint64_t geSpace = (v+0x6060606060606060)&mask8;
    // Find the positions that are > 126 (the 8th bit flips when adding 128-126-1)
    uint64_t gt126 = (v+0x0101010101010101(&mask8);
    // Find all unsafe positions
    uint64_t unsafePos = (geSpace&(~gt126))^mask8;
    // 0 is safe too
    uint64_t notnullPos = (v+0x7F7F7F7F7F7F7F7F)&mask8;

return !(unsafePos¬nullPos);
}
```

Figure 9C

Routine *asciiBlockToLower* for Converting an 8-Letter ASCII Block to Lower Case

```
static inline uint64_t asciiBlockToLower(uint64_t v)
// Convert an 8-byte block of ASCII characters to lower case
{
    // Find the positions that are >='A' (the 8th bit flips when adding 128-'A')
    uint64_t geA=(v+0x3F3F3F3F3F3F3F3F)&mask8;
    // Find the positions that are >'Z' (the 8th bit flips when adding 128-'Z'-1)
    uint64_t gtZ=(v+0x2525252525252525)&mask8;
    // Find all upper-case positions (i.e., >='A' but not >'Z')
    uint64_t upperPos=(geA&(~gtZ));

// All matching positions have a 128 in their byte. We want to add 32
    // instead ('a'-'A'), so shift first
    return v+(upperPos>>2);
}
```

HYBRID COMPARISON FOR UNICODE TEXT STRINGS CONSISTING PRIMARILY OF ASCII CHARACTERS

RELATED APPLICATIONS

This application claims priority to U.S. Provisional Patent Application No. 62/418,246, filed Nov. 6, 2016, which is incorporated by reference in its entirety.

TECHNICAL FIELD

The disclosed implementations relate generally to comparing text strings having Unicode encoding and applying the string comparison techniques to operations in database systems.

BACKGROUND

Characters can be encoded in various ways for use by computers. The American Standard Code for Information Interchange, or ASCII, is a character encoding standard widely used in database systems today. Another character encoding standard, Unicode, has a broader application than ASCII because it can handle text expressed in most of the world's writing systems. However, Unicode text processing is more costly than ASCII text processing. The costly nature of Unicode is particularly problematic when operations involve predominantly ASCII-based text, such as most operations in database systems (e.g., performing a hash join on text columns).

Today, UTF-8 is the dominant form of encoding for Unicode because it maintains full backward compatibility to ASCII. Specifically, each of the ASCII characters in the range 0x00 to 0x7F is a single-byte UTF-8 character. All other characters in UTF-8 use two, three, or four bytes.

SUMMARY

Accordingly, there is a need for text processing systems and methods that retain the high performance of ASCII and only resort to Unicode-based text processing when completely necessary. The techniques described here are directly applied to text strings encoded in UTF-8, but may be adapted to other Unicode encodings. One way to address the problem involves analyzing each text string to determine if it consists entirely of ASCII characters. If the text string consists of only ASCII characters (e.g., characters in the range 0x00-0x7F or further limited to 0x00 and 0x20-0x7E), then a weight is assigned to the text string using the ASCII codes of characters in the text string. This process is typically applied to blocks of characters (e.g., eight-byte blocks for a 64-bit processor).

If the text string includes at least one non-ASCII character (e.g., a Unicode character or an ASCII control character), the simple process does not work. However, in this case, the non-ASCII character may be replaceable by an equivalent ASCII character. If the non-ASCII character can be replaced, the routine can be reapplied to the modified text string (i.e., a weight is assigned to the text string using the ASCII codes, as described above). For example, a comparison may be designated as accent-insensitive, and the non-ASCII character is a Latin character with an accent (e.g., the character ü or the character ç).

However, in some instances, a non-ASCII character cannot be replaced with an equivalent ASCII character. For example, the comparison may be designated as accent-sensitive or the Unicode character may not be a Latin character with an accent (e.g., the Chinese character 喜). In this case, a slower process based on Unicode weighting can be applied.

In this way, the costly Unicode weighting process is avoided in most circumstances, unless replacement of a non-ASCII character is specifically prohibited. In database operations (e.g., hashing operations and equality operations) this is particularly valuable because the text strings used for comparison typically consist of pure ASCII text.

The string manipulation techniques include concatenating strings at various stages, and systems use various techniques to concatenate strings based on how strings are stored internally. As used herein, the symbol "+" will be used to denote string concatenation when the two items to be added are strings. For example, "abc"+"def"="abcdef" (string concatenation) and "25"+"79"="2579" (string concatenation), but 25+79=104 (integer addition). Specific implementations use appropriate functions, operators, or methods to perform concatenation, such as the strcat( ) function in C. When bitwise operations are applied to strings, the strings are typically converted to integers (e.g., a 64-bit unsigned integer uint64_t), in which case "+" represents addition. See FIGS. 9A and 9B.

In accordance with some implementations, a method of comparing text strings having Unicode encoding is performed at a computer having one or more processors, and memory storing one or more programs configured for execution by the one or more processors. The process receives a first text string $S_1$ with Unicode encoding and a second text string $S_2$ with Unicode encoding. For the first text string $S_1$, the process computes a first string weight according to a weight function $f$ that computes an ASCII prefix $f_A(S_1)$, computes a Unicode weight suffix $f_U(S_1)$, and concatenates the ASCII prefix to the Unicode weight suffix to form the first string weight $f(S_1)=f_A(S_1)+f_U(S_1)$. Computing the ASCII prefix for the first text string includes applying bitwise operations to n-byte contiguous blocks of the first text string to determine whether each block contains only ASCII characters, and replacing accented Unicode characters in the first text string with equivalent unaccented ASCII characters when comparison is designated as accent-insensitive. The number n is a predefined integer greater than or equal to 4. When the processing is running on a 64-bit processor, n is typically 8. Computing the Unicode weight suffix includes, when there is a first block containing a non-replaceable non-ASCII character, performing a character-by-character Unicode weight lookup beginning with the first block containing a non-replaceable non-ASCII character. The process computes, for the second text string $S_2$, a second string weight according to the same weight function $f$. The process then determines whether the first text string and the second text string are equal by comparing the first string weight to the second string weight.

In some instances, either the ASCII prefix or the Unicode weight suffix is an empty string. Both the ASCII prefix and the Unicode weight suffix are empty when the text string to process is empty. Note that any two empty strings are considered identical because they have no differing bytes.

In some instances, comparison is designated as case-insensitive. In this case, some implementations compute the ASCII prefix by applying a sequence of bitwise operations to convert upper-case ASCII characters to corresponding lower-case ASCII characters.

In some instances, the first and second string weights are compared directly. In other implementations, comparing the text strings uses a hash function h. A hash function h is not injective, but it can efficiently identify non-matching strings. In particular, when $h(f(S_1)) \neq h(f(S_2))$, the strings $S_1$ and $S_2$ are definitely not equal, which occurs for the majority of comparisons. On the other hand, when $h(f(S_1))=h(f(S_2))$, either $f(S_1)=f(S_2)$ or there is a hash collision between non-identical inputs. In this case, a slower technique is applied to determine if the string weights are actually equal.

In some instances, an input text string has a length that is not an exact multiple of n. Some implementations pad the text strings (on the right) so that the total length is an integer multiple of n. Typically padding consists of ASCII Null characters (0x00).

Typically, the ASCII prefix is computed iteratively, starting with an initial n-byte block of an input text string, sequentially processing n-byte blocks until reaching the end of the text string or reaching an n-byte block that contains a non-replaceable non-ASCII character. In some implementations, when the comparison is not designated as accent-insensitive (i.e., accents are relevant), every non-ASCII character is designated as non-replaceable. In some implementations, when the comparison is designated as accent-insensitive, each non-ASCII character is designated as non-replaceable when lookup of the respective non-ASCII character in an ASCII-equivalent table has no matching entry.

In some implementations, computing the Unicode weight suffix includes performing a lookup in a Unicode weight table to identify a respective primary weight, a respective accent weight, and a respective case-weight. This is performed for each character, beginning with the first block containing a non-replaceable non-ASCII character. After this is performed for each of the characters, the process forms a primary Unicode weight $w_p$ as a concatenation of the identified primary weights, forms an accent Unicode weight $w_a$ as a concatenation of the identified accent weights, and forms a case Unicode weight $w_c$ as a concatenation of the identified case weights. Finally, the process forms the Unicode weight suffix as a concatenation $w_p+w_a+w_c$ of the primary Unicode weight, the accent Unicode weight, and the case Unicode weight. In some instances, the comparison designates a specific language, and the Unicode weight table is selected according to the specific language.

In some implementations, a computing device includes one or more processors, memory, a display, and one or more programs stored in the memory. The programs are configured for execution by the one or more processors. The one or more programs include instructions for performing any of the methods described herein.

In some implementations, a non-transitory computer readable storage medium stores one or more programs configured for execution by a computing device having one or more processors and memory. The one or more programs include instructions for performing any of the methods described herein.

BRIEF DESCRIPTION OF THE DRAWINGS

For a better understanding of the aforementioned systems and methods, as well as additional systems and methods for comparing text strings, reference should be made to the Description of Implementations below, in conjunction with the following drawings in which like reference numerals refer to corresponding parts throughout the figures.

FIGS. 9A, 9B, and 9C provide routines that determine whether an 8-byte block consists of ASCII characters and/or whether the block consists of simple ASCII characters.

FIG. 10 provides a routine that converts upper case letters in an ASCII block to lower case letters.

DESCRIPTION OF IMPLEMENTATIONS

Reference will now be made to implementations, examples of which are illustrated in the accompanying drawings. In the following description, numerous specific details are set forth in order to provide an understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Figure 1:
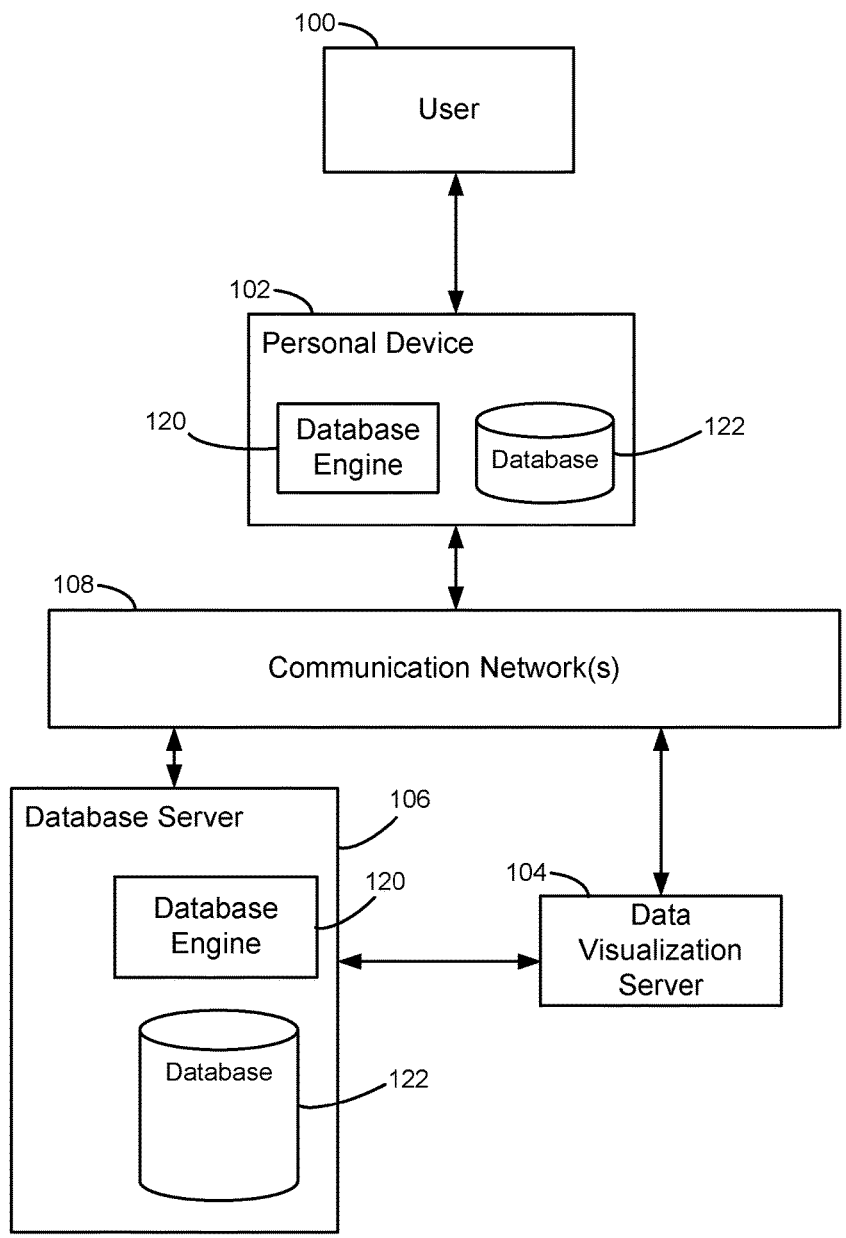
FIG. 1 is a block diagram illustrating a context in which some implementations operate.

FIG. 1 illustrates a context in which some implementations operate. A user 100 interacts with a personal device 102, such as a desktop computer, a laptop computer, a tablet computer, or a mobile computing device. A personal device 102 is an example of a computing device 200. The term "computing device" also includes server computers, which may be significantly more powerful than a personal device used by a single user, and are generally accessed by a user only indirectly. An example computing device 200 is described below with respect to FIG. 2, including various software programs or modules that execute on the device 200. In some implementations, the personal device 102 includes one or more desktop data sources 224 (e.g., CSV files or spreadsheet files). In some implementations, the personal device 102 includes a database engine 120, which provides access to one or more relational databases 122 (e.g., SQL databases). In some implementations, the personal device includes a data visualization application 222, which the user 100 uses to create data visualizations from the desktop data sources 224 and/or the relational databases 122. In this way, some implementations enable a user to visualize data that is stored locally on the personal device 102.

In some cases, the personal device 102 connects over one or more communications networks 108 to one or more external database servers 106 and/or a data visualization server 104. The communication networks 108 may include local area networks and/or wide area networks, such as the Internet. In some implementations, the data visualization server 104 provides a data visualization web application that runs within a web browser 220 on the personal device 102. In some implementations, data visualization functionality is provided by a local application 222 with certain functions provided by the data visualization server 104. For example, the data visualization server 104 may be used for resource intensive operations. In some implementations, the one or more database servers 106 include a database engine 120, which provides access to one or more databases 122 that are stored at the database server 106. As illustrated in FIG. 1, a database engine 120 and corresponding databases 122 may reside on either a local personal device 102 or on a database server 106. In some implementations (not illustrated here), the data visualization server 104 includes a database engine 120 and one or more databases 122.

Figure 2:
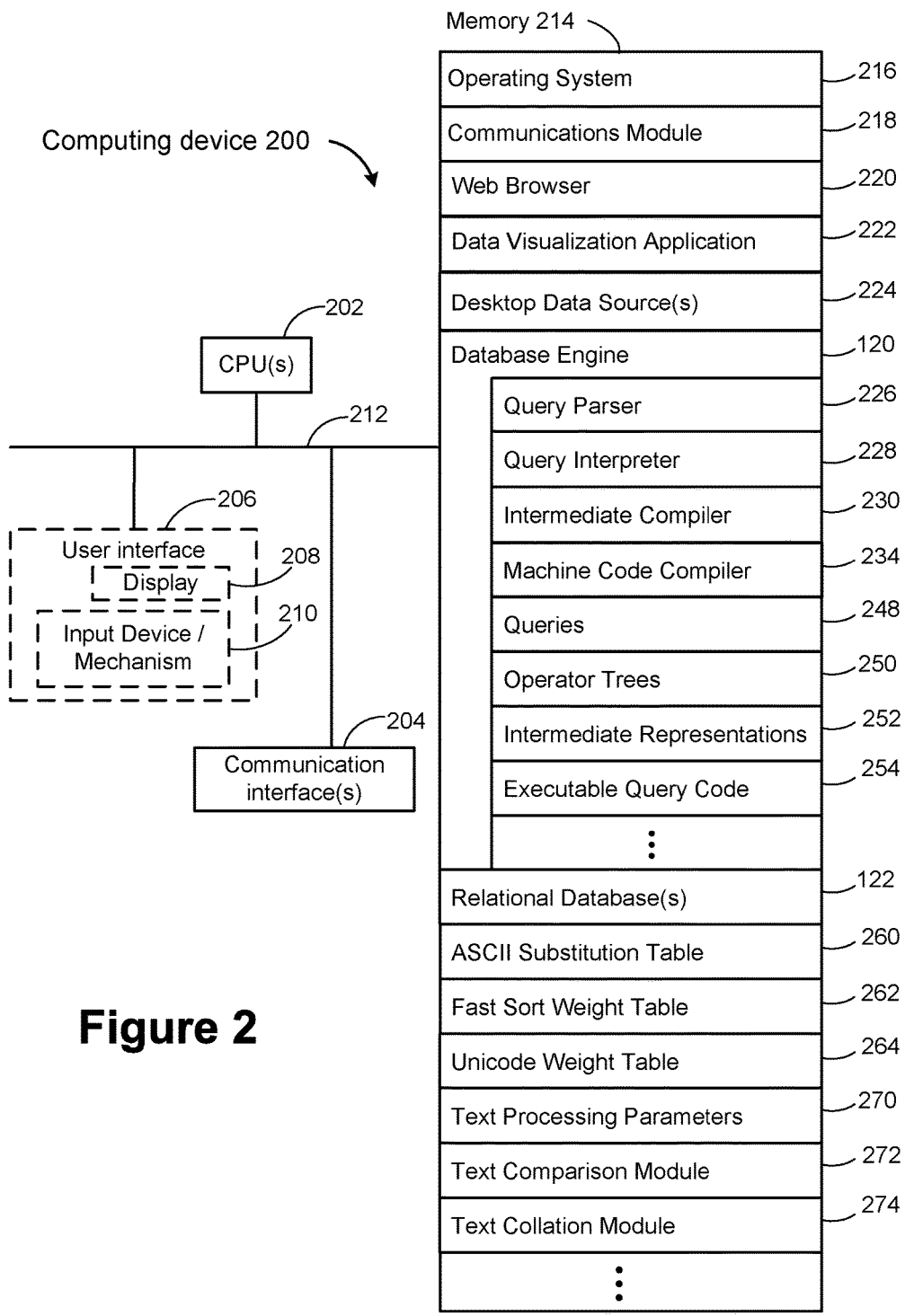
FIG. 2 is a block diagram of a computing device according to some implementations.

FIG. 2 is a block diagram illustrating a computing device 200 in accordance with some implementations. As used herein, the term "computing device" includes both personal devices 102 and servers, such as a database server 106 or a data visualization server 104. A computing device 200 typically includes one or more processing units/cores (CPUs) 202 for executing modules, programs, and/or instructions stored in the memory 214 and thereby performing processing operations; one or more network or other communications interfaces 204; memory 214; and one or more communication buses 212 for interconnecting these components. The communication buses 212 may include circuitry that interconnects and controls communications between system components. A computing device 200 may include a user interface 206 comprising a display device 208 and one or more input devices or mechanisms 210. In some implementations, the input device/mechanism 210 includes a keyboard. In some implementations, the input device/ mechanism includes a "soft" keyboard, which is displayed as needed on the display device 208, enabling a user to "press keys" that appear on the display 208. In some implementations, the display 208 and input device/mechanism 210 comprise a touch screen display (also called a touch sensitive display). In some implementations, the memory 214 includes high-speed random-access memory, such as DRAM, SRAM, DDR RAM, or other random access solid state memory devices. In some implementations, the memory 214 includes non-volatile memory, such as one or more magnetic disk storage devices, optical disk storage devices, flash memory devices, or other non-volatile solid-state storage devices. In some implementations, the memory 214 includes one or more storage devices remotely located from the CPU(s) 202. The memory 214, or alternatively the non-volatile memory device(s) within the memory 214, comprises a non-transitory computer readable storage medium. In some implementations, the memory 214, or the computer readable storage medium of the memory 214, stores the following programs, modules, and data structures, or a subset thereof:

- an operating system 216, which includes procedures for handling various basic system services and for performing hardware dependent tasks;
- a communications module 218, which is used for connecting the computing device 200 to other computers and devices via the one or more communication network interfaces 204 (wired or wireless) and one or more communication networks 108, such as the Internet, other wide area networks, local area networks, metropolitan area networks, and so on;
- a web browser 220 (or other client application), which enables a user 100 to communicate over a network with remote computers or devices. In some implementations, the web browser 220 executes a data visualization web application (not shown) downloaded from a data visualization server 104. In some implementations, a data visualization web application (not shown) is an alternative to storing a data visualization application 222 locally;
- a data visualization application 222, which enables users to construct data visualizations from various data sources. The data visualization application 222 retrieves data from one or more data sources, such as a desktop data source 224 (e.g., a CSV file or a flat file), a relational database 122 stored locally, or a desktop data source or relational database 122 stored on another device (such as a database server 106). The data visualization application then generates and displays the retrieved information in one or more data visualizations;
- zero or more desktop data sources 224, which have data that may be used and displayed by the data visualization application 222. Data sources 224 can be formatted in many different ways, such as spreadsheets, XML files, flat files, CSV files, text files, JSON files, or desktop database files. Typically, the desktop data sources 224 are used by other applications as well (e.g., a spreadsheet application);
- a database engine 120, which receives database queries 248 (e.g., query from a data visualization application 222) and returns corresponding data. The database engine 120 typically includes a plurality of executable modules;
- the database engine 120 invokes a query parser 226, which parses each received query 248 (e.g., an SQL database query) to form an operator tree 250. An operator tree is sometimes referred to as an expression tree, an algebra tree, or an execution tree. In some implementations, the query parser 226 is contained within the intermediate compiler 230;
- the database engine 120 includes an intermediate compiler 230, which translates each operator tree 250 into an intermediate representation (IR) 252 (e.g., LLVM code). In some implementations, the intermediate compiler 230 includes a logical optimizer, which modifies an operator tree 250 to produce a (theoretically) more efficient execution plan. The logical optimizer is generally capable of identifying multiple types of optimization based on the structure of the operator tree and the data requested;
- in some implementations, the database engine 120 includes a query interpreter 228 (also called a byte code interpreter), which interprets the intermediate representation directly to retrieve result sets from the databases 122;
- in some implementations, the database engine 120 includes a machine code compiler 234, which translates an intermediate representation into executable machine code 254. In some implementations, the machine code compiler 234 selects between in-memory operators and spooling operators depending on available memory; and
- in some implementations, the machine code compiler 234 includes a code optimizer, which performs one or more optimization passes on the intermediate representation 252 to form an optimized intermediate representation 252. The optimized intermediate representation is then translated into optimized executable machine code 254 by the machine code compiler 234. In some implementations, the code optimizer selects between in-memory operators and spooling operators depending on available memory.

The computing device 200 may also include data and executable modules to compare and collate text strings. The text comparison module 272 is used for determining whether two text strings are considered equal. Note that text comparison can occur in multiple phases. For example, to implement a hash join between two database tables, data values for one side of the join are processed and hashed, and these values are later compared to hash values computed for the second side of the join. Because text comparisons can be performed according to various text processing parameters (e.g., accent sensitive/insensitive and case sensitive/insensitive), two text strings can be classified as equal without being identical. In some implementations, the text comparison module 272 uses an ASCII substitution table 260, as illustrated below in FIG. 5. Typically, the ASCII substitution table 260 has entries for a small number of Unicode characters (e.g., commonly accented Latin characters). In some implementations, the text comparison module 272 uses a Unicode Weight table 264 when necessary, as illustrated in FIG. 6 below.

Figure 7:
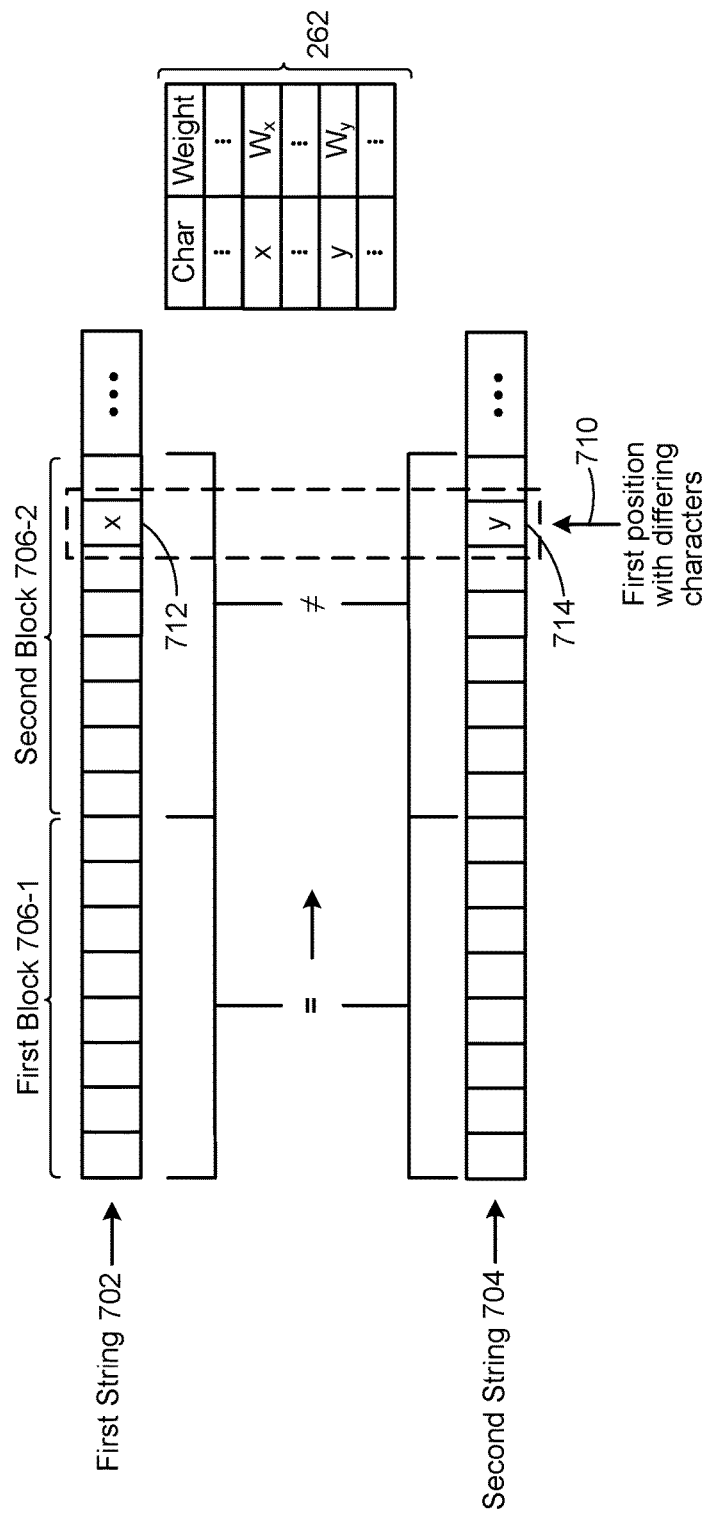
FIG. 7 illustrates a lexicographic comparison between two text strings according to some implementations.
Figure 8:
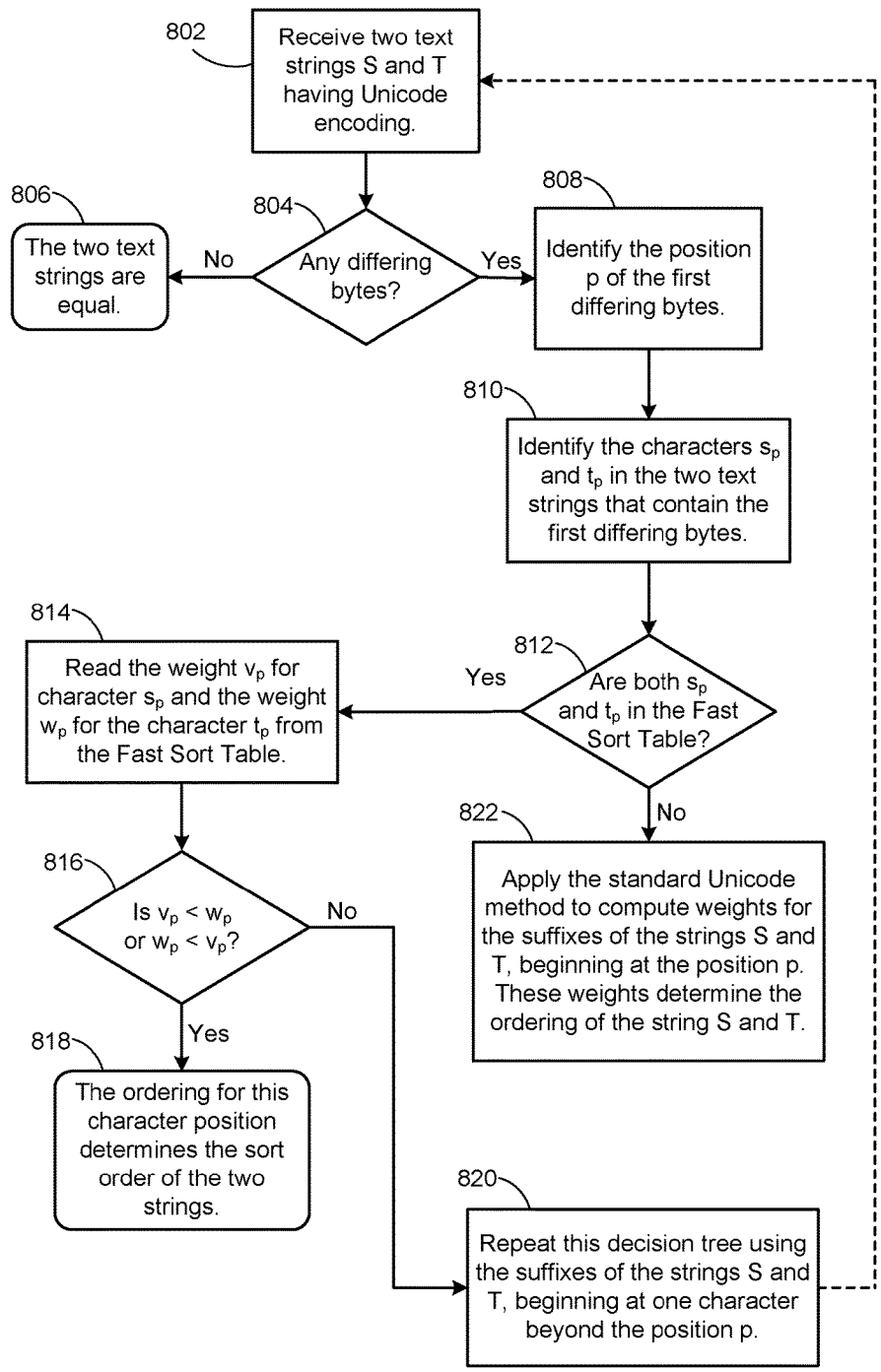
FIG. 8 provides a process flow for efficient collation of text strings according to some implementations.

In some implementations, the computing device 200 includes a text collation module 274. Given a pair of text strings $S_1$ and $S_2$, the text collation module determines whether $S_1 < S_2$, $S_1 = S_2$, or $S_1 > S_2$, as illustrated in FIGS. 7 and 8 below. In some implementations, the text collation module 274 uses a Fast Sort Weight table 262, which enables fast collation for most cases. In some implementations, the Fast Sort Weight table 262 includes entries for all non-control ASCII characters (e.g., 0x00 and characters in the range 0x20 through 0x7E), as well as a small number of accented characters. In practice, there is a logically distinct Fast Sort Weight table for each language (because different languages collate the characters differently) and comparison strength (e.g., whether accent and/or case sensitive). However, the data for all of the logically distinct Fast Sort Weight tables is typically stored in a single physical table. In some implementations, each logically distinct Fast Sort Weight table has weights encoded using a single byte. As illustrated in FIG. 8, the text collation module 274 also uses the Unicode Weight table 264 when necessary. Both the comparison module 272 and the collation module 274 use a set of text processing parameters 270, which specify language, accent sensitivity, and case sensitivity.

Each of the above identified executable modules, applications, or sets of procedures may be stored in one or more of the previously mentioned memory devices, and corresponds to a set of instructions for performing a function described above. The above identified modules or programs (i.e., sets of instructions) need not be implemented as separate software programs, procedures, or modules, and thus various subsets of these modules may be combined or otherwise rearranged in various implementations. In some implementations, the memory 214 stores a subset of the modules and data structures identified above. Furthermore, in some implementations, the memory 214 stores additional modules or data structures not described above.

Although FIG. 2 shows a computing device 200, FIG. 2 is intended more as a functional description of the various features that may be present rather than as a structural schematic of the implementations described herein. In practice, and as recognized by those of ordinary skill in the art, items shown separately could be combined and some items could be separated.

Typically, comparing Unicode strings involves determining weights of each letter of each string. These weights consist of three parts that are merged and concatenated to form the basis for comparison as well as for hashing. The overhead of converting each letter to its corresponding weight by a table lookup creates substantial inefficiency in contrast to pure ASCII-based implementations that can just rely on the ASCII weights of the letters. This is prohibitively expensive for database operations that deal predominantly with ASCII letters with only a few Unicode symbols interspersed. In particular, database systems typically implement hash-based algorithms for joins, grouping, and aggregation, and a single database query many have many of these types of operations. When a user is expecting query results almost instantaneously, the slow process of looking up Unicode weights for all characters can lead to unhappy users.

Some implementations are based on UTF-8 Unicode encoding. UTF-8 was designed to contain the 7-bit encoded ASCII characters one-to-one. When a string with a long initial ASCII portion is encountered, implementations can take a short-cut from the costly weight-based comparison procedure, operating directly on the Unicode encoding. Some implementations process 8-byte blocks (typically 8 ASCII characters) at a time using arithmetic and bit-wise operations on the 64-bit integer representation of the block. This provides a huge performance gain compared to the indirect comparison method using multiple weight components.

The following example illustrates the slow Unicode process using weight components. Consider the three letter Unicode word $L_1L_2L_3$. For collation (sorting) operations the word is segmented into the three symbols. The symbols are individually assigned weights, which consist of several (most often three) fragments:

$$W(L_1)=wp_1ws_1wt_1$$

$$W(L_2)=wp_2ws_2wt_2$$

$$W(L_3)=wp_3ws_3wt_3$$

The first (primary) weight component (identified by "wp")) constitutes the weight of the base symbol, not differentiating between small and capital letters or accents. The secondary component (identified by "ws") determines the weight of the accent, if there is any. The third (tertiary) component (identified by "wt") determines whether the letter is capitalized or lower case. The weight for sorting or comparing entire words, such as the three letter word $L_1L_2L_3$ is determined by first concatenating the first components, then the second components, and finally the third components of the individual weights. The final weight is therefore $W(L_1L_2L_3)=wp_1wp_2wp_3ws_1ws_2ws_3\ wt_1wt_2wt_3$. If the comparison to be performed is case-insensitive, the tertiary components $wt_1wt_2wt_3$ are omitted from the final weight. If the comparison to be performed is accent-insensitive, the secondary components $ws_1ws_2ws_3$ are omitted from the final weight. If a comparison is both accent-insensitive and case-insensitive, the final weight consists of just the primary components $W(L_1L_2L_3)=wp_1wp_2wp_3$.

Consider a concrete example. The first weight components of the four letters a, A, ä, Ä are all identical (e.g., 0x29). The primary weight components of the letters b and B are also identical (e.g., 0x2A). The second component handles the accents/umlauts. In some implementations, a character with no accent is encoded as 0x05 and an umlaut accent has a weight of 0x4596. Capital and lower-case letters are differentiated in the third weight component. In some implementations, upper case Latin letters have a case weight of 0xDC and lower case Latin letters have a case weight of 0x05.

With this example weight encoding, the sort keys for some symbols are (depending on the collation strength—case sensitive, accent-sensitive—that is specified):

$W(a)$=29 05 05

$W(b)$=2A 05 05

$W(B)$=2A 05 DC $W(ä)$=29 4596 05

$W(Ä)$=29 4596 DC

Therefore, the weight of the word "abÄ" is 29 2A 29 05 05 4596 05 05 DC.

Figure 3:
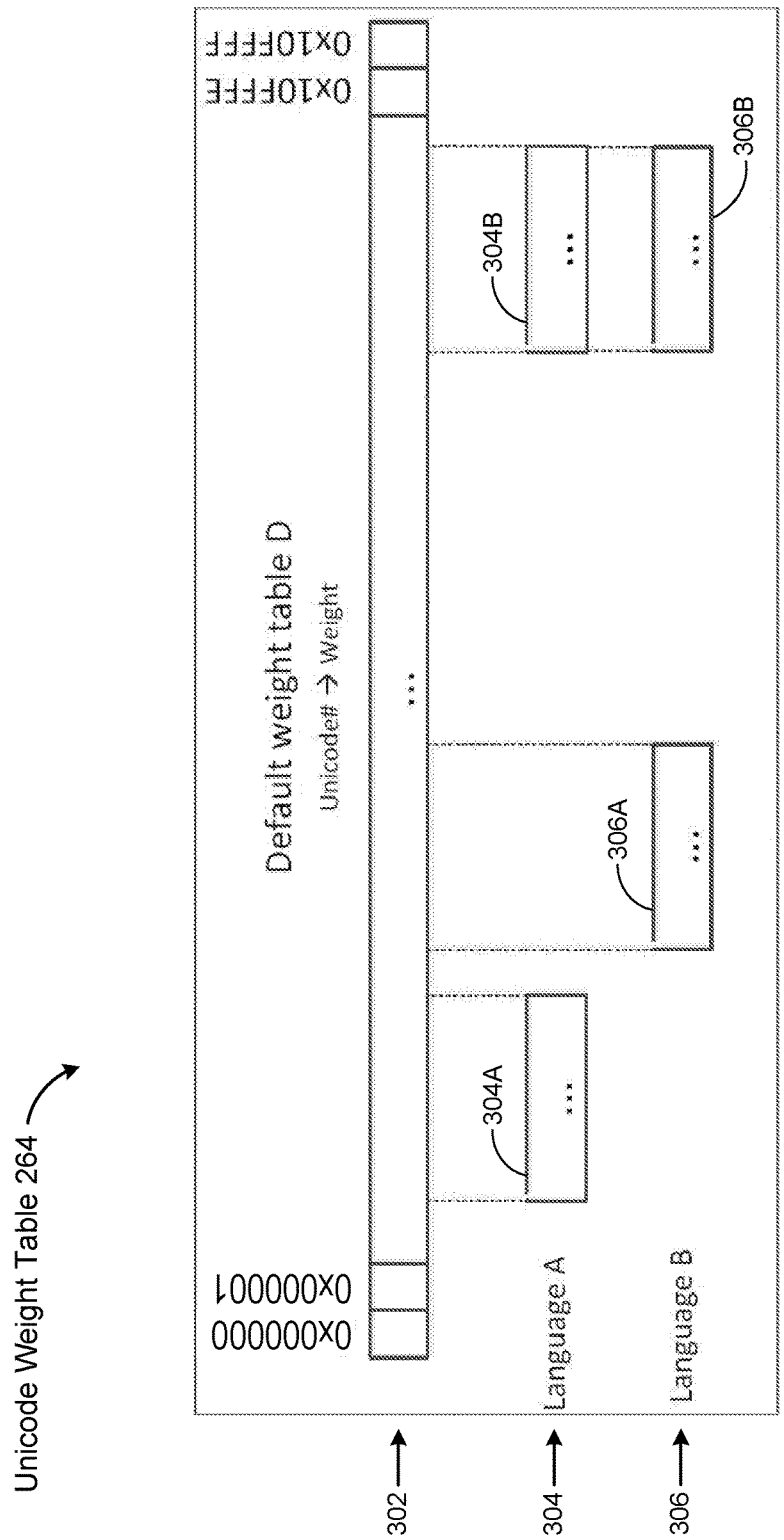
FIG. 3 illustrates a Unicode Weight table, which provides collation weights that are language specific, in accordance with some implementations.

FIG. 3 illustrates a Unicode Weight table 264, which is used for data processing operations that involve Unicode characters, in accordance with some implementations. The weights assigned to words can be used for hashing, sorting, and equality comparison operations. The Unicode Weight table 264 includes a default weight table 302, which assigns default weights to each Unicode symbol. The default weight table 302 is an array indexed from 0x000000 to 0x10FFFF, which spans the entire Unicode range of symbols. The default weight table 302 specifies several individual weight components, including a primary weight for the base symbol, an accent weight, and a case weight (for upper or lower case). In some implementations, the default weight table 302 is compressed to avoid consuming storage space for large ranges of potential code points that are unused.

When comparing text strings, a language is specified or known, so the comparison has to perform the comparison according to the rules for that language. For each language, the Unicode Weight table 264 includes language specific weights for certain symbols. Each language typically has a small number of symbols that are different from the default weight table 302, so the differences are stored as overrides. Typically, the overrides are stored as ranges rather than individual overrides. Some implementations store overrides in ranges of 32 characters. Other implementations store larger or smaller ranges. FIG. 3 illustrates the overrides 304 for Language A and the overrides 306 for Language B. The overrides for Language A include two ranges 304A and 304B, and the overrides for Language B include two ranges 306A and 306B. Note that the ranges 304A and 306A are distinct ranges of Unicode characters, whereas the ranges 304B and 306B both provide overrides for the same range of Unicode characters.

In some implementations, the override table entries (e.g., an entry in the Language A range 304A) do not always contain the three component weights of the corresponding symbol because some Unicode symbols are assigned multiple different weights. In this case, the entry is a pointer to a separate list of weights or a pointer to a small trie data structure that can be used to determine the proper weight.

Performing comparison operations using the Unicode Weight table 264 is a resource intensive process, especially when millions of text strings are involved. This process is particularly excessive when the text strings contain mostly ASCII characters (e.g., for the text operations performed by a database engine 120). The disclosed processes employ a hybrid approach, which is very fast for the most common cases of pure ASCII text, and falls back to the slower process only when necessary.

Figure 4:
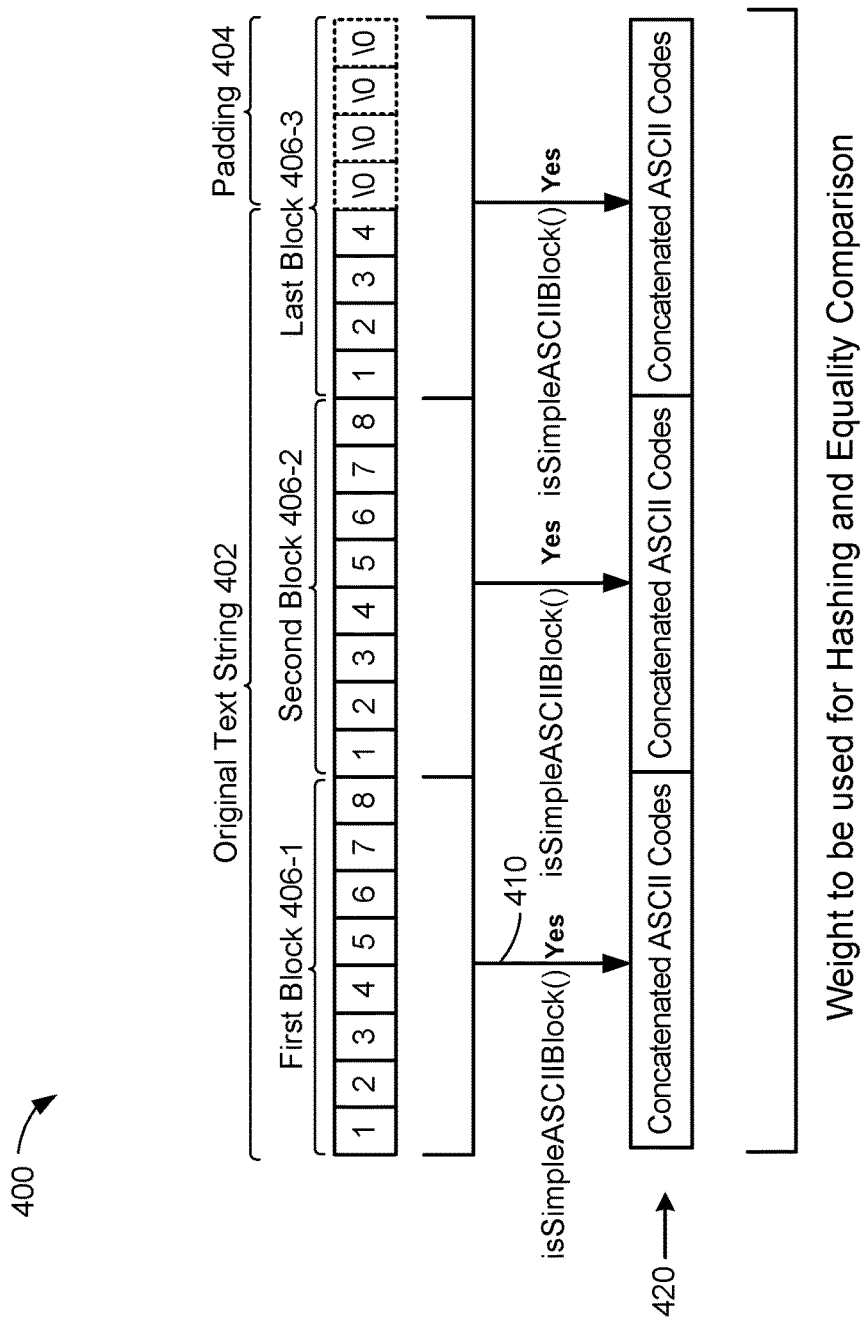
FIG. 4 illustrates computing a weight for a text string that consists of ASCII characters according to some implementations.

FIG. 4 illustrates a text string processing operation 400 when the string consists entirely of ASCII characters, in accordance with some implementations. In this example, the string 402 is broken into blocks of eight characters, and it is only 20 bytes long, so it is padded with four bytes of padding 404 (typically using ASCII Null characters \0). The string 402, together with the padding 404, is partitioned into a series of three blocks 406-1, 406-2, and 406-3, with each block 402 having eight bytes (corresponding to the predefined block size). In some implementations, partitioning the string 402 into blocks occurs before processing any of the blocks. In some implementations, the blocks are identified one by one dynamically, with a new block identified as soon as the previous one is processed. Although eight-byte blocks are shown in FIG. 4, other implementations have different block sizes (e.g., 4-byte blocks or 16-byte blocks).

Each block is evaluated to determine if it consists of just simple ASCII characters. In some implementations, this is a two-part test. First, a test is performed to determine if the characters are just ASCII characters (i.e., in the range 0x00 to 0x7F). If the characters are in this range, a second test is performed to determine if there are any ASCII control characters (i.e., 0x01 to 0x1F and 0x7F). Some implementations use the routine isSimpleASCIIBlock( ) illustrated in FIG. 9A. Note that the constant mask8 in FIGS. 9A, 9B, 9C, and 10 is the value 0x8080808080808080. Because all ASCII characters have a 0 as the high order bit (and all non-ASCII characters have a 1 as the high order bit in every byte), performing a bitwise AND between mask8 and a pure ASCII block results in 0x0000000000000000.

Some implementations separately use the functions blockIsASCII( ) in FIG. 9B and the function asciiBlockIsSimple( ) illustrated in FIG. 9C, which distinguishes between "real" characters and ASCII control characters. It is convenient to designate ASCII Null (which can be written as 0x00 or \0) as a "simple" ASCII character. As illustrated in FIGS. 9A, 9B, and 9C, these routines use 64-bit integer arithmetic and bitmask operations, each being executed in a single machine cycle, which results is an efficient process for determining if the blocks consist of only ASCII characters.

In accordance with Unicode comparison standards, ASCII control characters are typically ignored when comparing character strings. For example, a text string that has an embedded Bel character (0x07) is considered equal to the text string with the Bel character removed. Therefore, some implementations use a function to strip out the ASCII control characters from each text string. In some implementations, the function asciiBlockIs Simple( ) or the function isSimpleASCIIBlock( ) is enhanced to remove these ASCII control characters.

In the example shown in FIG. 4, the isSimpleASCII-Block( ) routine is executed (410) for each block, and the answer in each case is Yes. In this case, the weight for each block is just the block itself (i.e., the concatenated ASCII codes for each of the ASCII characters in the block). For example, if the respective block is the word "computer," the associated ASCII codes are as follows: "c" is 0x63; "o" is 0x70; "m" is 0x6D; "p" is 0x71; "u" is 0x75; "t" is 0x74; "e" is 0x65; and "r" is 0x72. When these ASCII codes are concatenated, the weight for the word "computer" is 0x63706D7175746572. This weight determining process, which simply uses the ASCII codes as the weight, is far simpler than the process based on Unicode, as described below with reference to FIG. 6. The weights for each of the blocks are concatenated to form the overall weight 420.

In some implementations, the routine asciiBlock-ToLower( ) 1000 is called to convert upper case letters to lower case (or vice versa). This routine is illustrated in FIG. 10. This routine uses 64-bit integer arithmetic and bitmask operations, each being executed in a single machine cycle. By converting text strings to lower case, differences based on case are eliminated, such as the difference between the word "Computer" and the word "computer."

If at least one block contains at least one non-ASCII character, additional steps determine if the non-ASCII character can be replaced with an equivalent ASCII character. This is illustrated in FIG. 5.

Note that the overall weight 420 is used for testing equality of strings, not for sorting strings. In particular, the ASCII codes used to form the overall weight are not assigned in a lexicographic collation order. For example, the ASCII code for the letter "a" is 97, which is greater than the ASCII code for the letter "Z," which is 90. Techniques for faster sorting of strings with Unicode encoding are illustrated in FIGS. 7 and 8.

If a block contains a non-ASCII character, it might still be possible to remedy the situation. This is illustrated in FIG. 5. Depending on the strength-level that is desired for the comparison (e.g., whether the comparison is case-sensitive and/or accent-sensitive) some non-ASCII characters can be replaced by ASCII characters that are considered "equivalent." For example, if accent-insensitive string operations are desired, the "ç" in garçon can be replaced by the ASCII equivalent "c". After the replacement, the previously problematic block can be handled as an ASCII block. The ASCII equivalence is determined by a language/strength-dependent ASCII equivalence table 260 as illustrated in FIG. 5.

Figure 5:
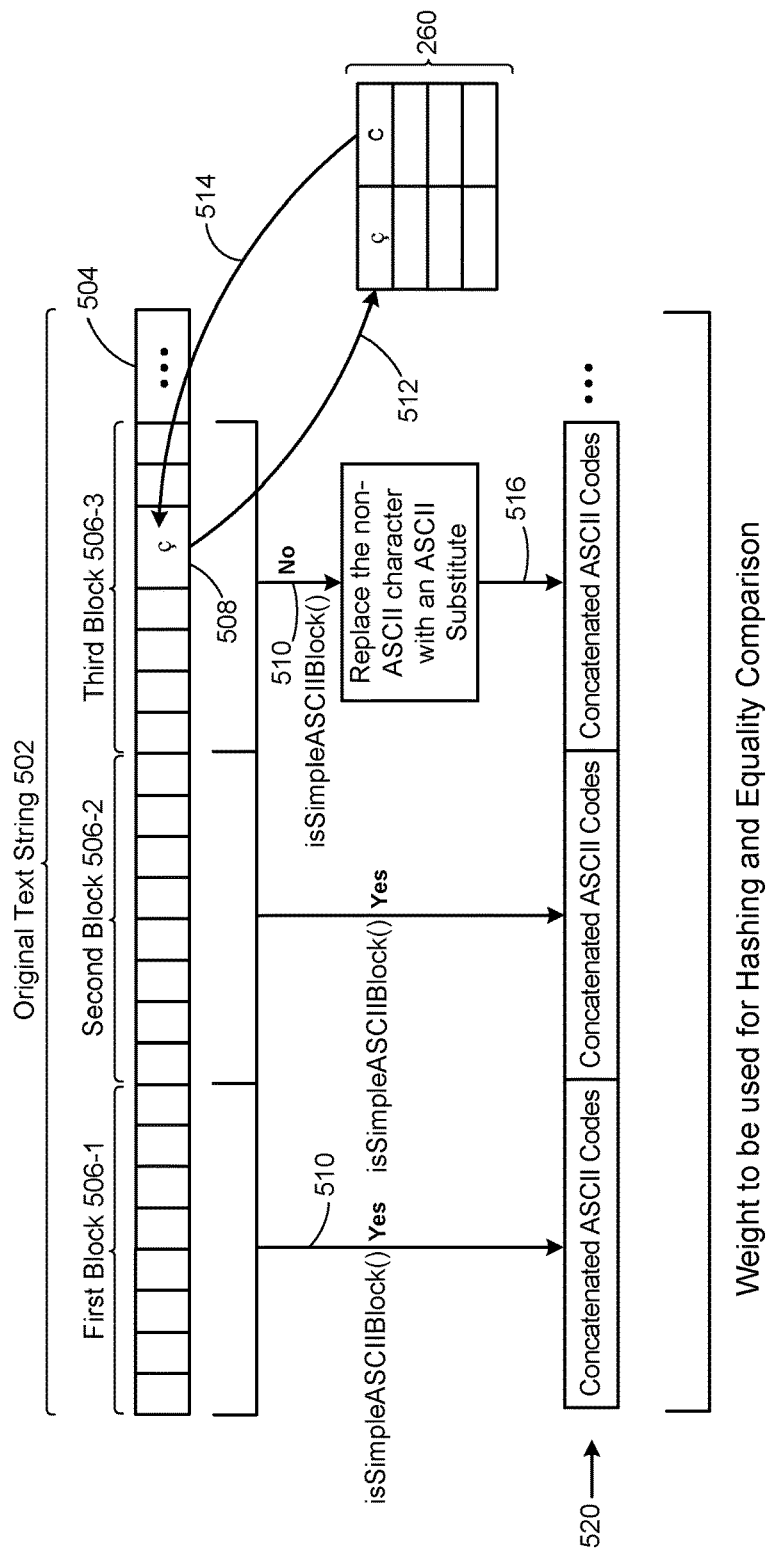
FIG. 5 illustrates computing a weight for a text string by replacing non-ASCII characters with corresponding ASCII characters, in accordance with some implementations.
Figure 6:
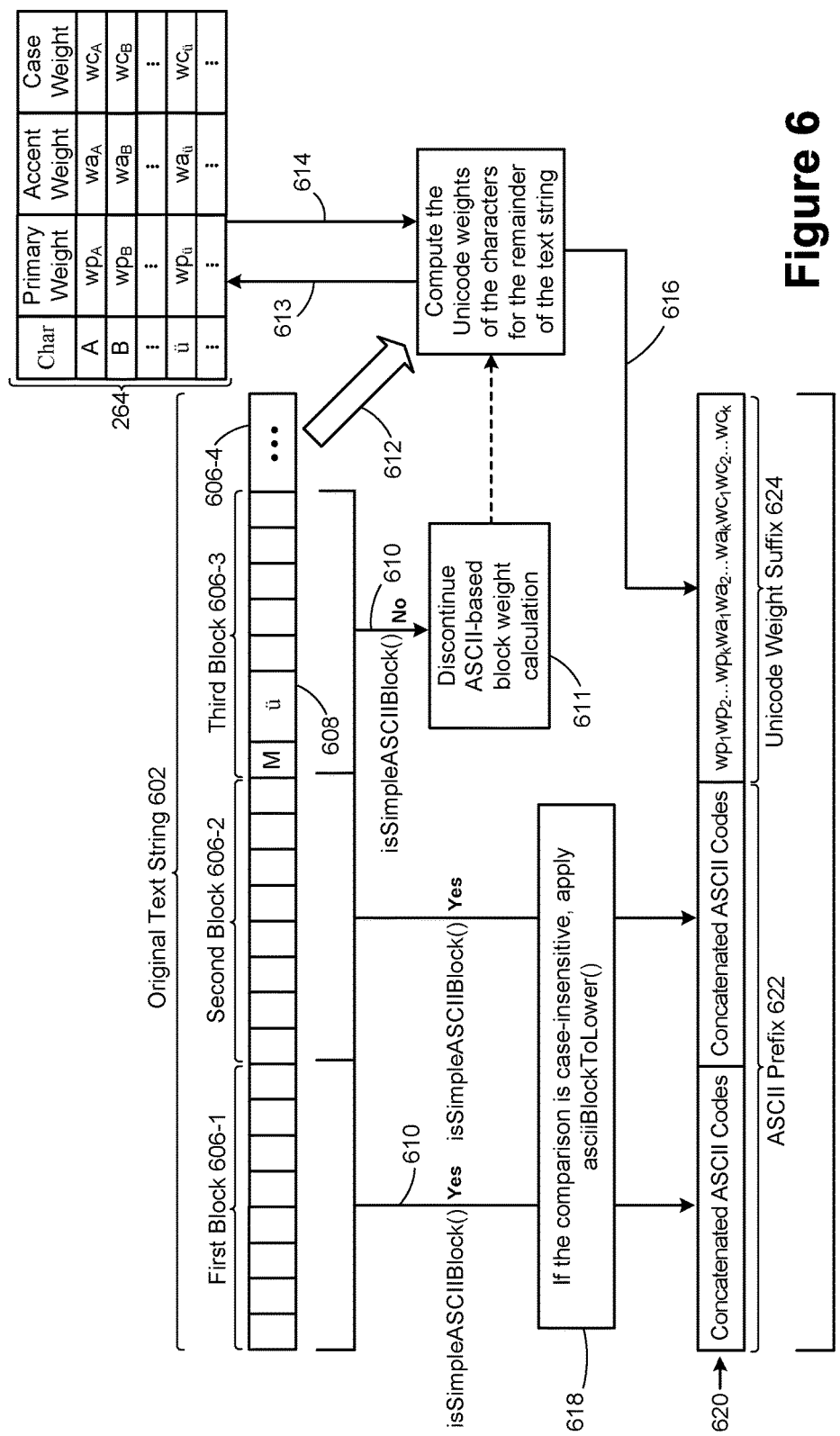
FIG. 6 illustrates computing a weight for a text string that includes a non-replaceable non-ASCII character, in accordance with some implementations.

As shown in FIG. 5, an original text string 502 has one or more blocks, such as 8-byte blocks. In some implementations, partitioning the text string 502 into blocks is performed at the outset, but in other cases, the blocks are identified one-by-one dynamically. For the first two blocks 506-1 and 506-2, the routine isSimpleASCIIBlock( ) determines (510) that they consist of pure ASCII characters (and in some implementations, simple ASCII characters), so the characters in these blocks are included directly in the overall computed weight 520. The third block 506-3, however, includes at least one non-ASCII character ç 508. Note that this non-ASCII character 508 spans two bytes, and some non-ASCII characters span 3 or 4 bytes. The third block 506-3 is evaluated (510) using the routine isSimpleASCII-Block( ) revealing that it contains a non-ASCII character 508.

An ASCII Substitution table 260 is used to see if the non-ASCII character 508 can be replaced by an "equivalent" ASCII character. The ASCII Substitution table 260 depends on both the designated language for the comparison as well as the strength parameters 270 (e.g., whether the comparison will be case-insensitive and/or accent-insensitive). In this illustration of FIG. 5, the process looks up (512) the non-ASCII character ç 508 in the ASCII substitution table 260, and a match is found. The corresponding ASCII character is "c" replaces (514) the non-ASCII character. If there is more than one non-ASCII character in the block, the lookup process may be repeated. When the non-ASCII characters in a block can all be replaced with corresponding ASCII characters, the block with substitutions is used (516) in the overall string weight 520. If any of the non-ASCII characters are not replaceable, some implementations use the process illustrated in FIG. 6.

Replacement of non-ASCII characters with equivalent ASCII characters introduces at least two complexities when processing the characters in blocks. First, a non-ASCII character consists of two or more bytes, but the replacement ASCII character consists of only a single byte. In some implementations, the shortened block is used directly in the formation of the overall string weight 520. Some implementations fill in using one or more additional bytes from the end portion 504 of the text string 502 beyond the current block (e.g., shifting left). When shifting in additional bytes, the block has to be rechecked (510) to confirm that it is an ASCII block. Because of substitution and the need for shifting, some implementations identify the blocks one at a time dynamically rather than building all of the blocks at the outset and rebuilding the blocks later after a shift.

A second complexity is that an ASCII character may span more than a single block. For example, the first byte of the non-ASCII character ç is 0xC3, which may be the 8th byte in a block. It is recognized as the beginning of a non-ASCII character, and the first byte indicates that there is one more byte to complete the character. The second byte 0xA7 is the next byte beyond the current block, so this byte is read in order to form the complete character 0xC3A7 (i.e., the letter "ç"). As illustrated above, this character is looked up (512) in the ASCII substitution table 260, and the ASCII character c replaces (514) it. In this case, the replacement fills out one full block (e.g., an 8-byte block here), so it can be copied (516) directly to the overall weight 520. In this scenario, the shifting occurs when processing the subsequent blocks from the end portion 504.

Because of shifting, some implementations wait to insert padding until the final block is being processed.

FIG. 6 illustrates processing a text string 602 that includes at least one non-replaceable non-ASCII character 608. Similar to the string 502 in FIG. 5, the first two blocks 606-1 and 606-2 are determined (610) to be ASCII blocks, so the bytes in these blocks are transferred to the overall string weight 620, forming the ASCII prefix 622 of the overall weight 620. In accordance with some implementations, when the comparison is designated as case insensitive, the process applies the routine asciiBlockToLower( ) as illustrated in FIG. 10, to efficiently convert (618) uppercase ASCII letters to lower case.

When the non-ASCII character 608 is identified (610) in the third block 606-3, a first test is performed to determine whether the non-ASCII character can be replaced by an equivalent ASCII character, as illustrated in FIG. 5. Depending on the language and the setting of the accent-sensitivity parameter 270, the character ü 608 may be replaceable. For the example in FIG. 6, we assume that the non-ASCII character 608 is not replaceable (e.g., the comparison operation is accent-sensitive).

As soon as a non-replaceable non-ASCII character 608 is encountered in a text string 602, the process reverts to the slower Unicode process. In some implementations, if the non-ASCII character 608 is not the first character in a block, the portion of the block before the non-ASCII character is included in the ASCII prefix 622 of the overall weight 620. In other implementations, once a block with a non-replaceable non-ASCII character is encountered, the slow Unicode process begins with the first character of the block. Once the slow Unicode process is initiated for a text string 602, it is performed for the remainder of the string. That is, the process discontinues (611) the ASCII-based block weight calculation, and performs the slower Unicode weight calculation holistically for the third block 606-3 together with any additional characters 606-4 in the text string 602 beyond the third block 606-3

Here, assume that the remainder, starting with the third block 606-3 (and including any additional characters 606-4), has k characters, which is generally a mixture of ASCII characters (each character consisting of a single byte) and one or more Unicode characters (each consisting of two or more bytes). The remainder is used (612) by the Unicode process. If the characters are labeled as $L_1, L_2, \ldots, L_k$, their weights are retrieved (614) by looking them up (613) in the Unicode weight table 264. As discussed above with respect to FIG. 3, the Unicode weight table 264 is determined by both the comparison language and the strength parameters 270. The weights are:

$$W(L_1) = wp_1 wa_1 wc_1$$

$$W(L_2) = wp_2 wa_2 wc_2$$

$$\ldots$$

$$W(L_k) = wp_k wa_k wc_k$$

where W is the weight for a given character, wp is the primary weight (the base symbol), wa is the accent weight (also known as the secondary weight), and we is the case weight (also known as tertiary weight, which has differing values depending on whether the character is upper case or lower case. The weights are concatenated (616) using the primary weights first, the accent weights second, and finally the case weights, to form the Unicode weight suffix 624. Here, the Unicode weight suffix 624 is:

$$W(L_1 L_2 \ldots L_k) = wp_1 wp_2 \ldots wp_k wa_1 wa_2 \ldots wa_k wc_1 wc_2 wc_k$$

In most cases, either the entire string 602 consists of ASCII characters (as illustrated in FIG. 4) or has a very small number of non-ASCII characters that are replaceable (as illustrated in FIG. 5). In these two cases, the ASCII prefix 622 is the entire overall weight 620, and the Unicode weight suffix 624 is empty. Even when there is at least one non-replaceable non-ASCII character 608 as illustrated in FIG. 6, the slow Unicode is applied only to the extent needed, which does not include the ASCII prefix 622. If the first non-replaceable non-ASCII character is in the first block 606-1, the ASCII prefix is empty, and the overall weight 620 is the Unicode weight suffix 624.

FIG. 7 illustrates a lexicographic comparison between two text strings 702 and 704, in accordance with some implementations. As noted above, weights assigned to a text string that are based on ASCII codes typically cannot be used for sorting operations. However, using Unicode-based weights for collation is resource intensive and slow.

To illustrate, a general sorting operation includes sorting a first text string 702 and a second text string 704. To perform the sort using Unicode-based weights, the computer compares the primary weight (e.g., wp) of the first character in the first text string 702 to the primary weight of the first character in the second text string 704. If the two primary weights are the same, the computer compares the primary weight of the second character in the first text string 702 to the primary weight of the second character in the second text string 704, and so on (a "first pass"). If the primary weights for all of the characters of both text strings are the same, the computer compares the secondary weight (e.g., wa) of the first character in the first text string 702 to the secondary weight of the first character in the second text string 704. If these two secondary weights are the same, the computer compares the secondary weight of the second character in the first text string 702 to the secondary weight of the second character in the second text string 704, and so on (a "second pass"). Finally, if the secondary weights for all the characters of both text strings are the same, the computer compares tertiary weights (a "third pass"). When millions of text strings are involved, this process is cumbersome and time consuming.

In come implementations, lexicographic comparisons use a fast sort weight table 262, which contains weight assignments for ASCII characters (and perhaps some other characters, such as common Unicode characters found in database processing). The weight assignments are derived from the primary weights (wp) of Unicode characters. In doing so, the lengthy Unicode weights described above with reference to FIG. 6 are simply remapped to one-byte integers. Such a configuration reduces the amount of memory consumed.

This approach proceeds one character position at a time, comparing each character in the first text string 702 to a corresponding character in the second text string 704 (e.g., the first character in the first text string 702 is compared to the first character in the second text string 704, the second character in the first text string 702 is compared to the second character in the second text string 704, and so on). If this process does not find any differing characters, the two text string are designated as equal. Otherwise, the process finds a first character in the first text string 702 that differs from the corresponding character in the second text string 704.

For example, at position 710, the character x 712 in the first text string 702 differs from the character y 714 in the second text string 704 (not literally the characters "x" and "y"). These characters are searched for in the fast sort weight table 262 to determine the weights $W_x$ and $W_y$. When $W_x$ is less than $W_y$, the first text string 702 is ordered first in the collation order. Alternatively, when $W_y$ is less than $W_x$, the second text string 704 is ordered first in the collation order. This approach in particular useful when the difference between the characters is either an accent-based difference or a case-based difference because the "second pass" and the "third pass" are typically avoided.

In some instances, the fast sort weight table 262 is missing one or both of the characters. In this case, the computer resorts to the general technique described above that relies on lengthy Unicode weights. However, because database operations typically involve ASCII characters, the process avoids the slow general technique most of the time.

Some implementations use block level comparisons initially (e.g., 8-byte blocks). In some cases, block level comparisons can quickly identify the first differing byte within the two strings. For example, comparing the first block 706-1 of the first string 702 to the corresponding block of the second string 704 reveals that they are the same. However, comparing the second block 706-2 of the first string 702 to the corresponding block of the second string 704 reveals that the second blocks have differing characters at the position 710. When using block level comparison initially, implementations first identify differing bytes, then determine what characters contain those bytes. In most cases, the differing bytes are ASCII characters. However, in some instances the first differing byte may be a portion of a Unicode character. In some of these instances, the first differing byte is the first byte of a multi-byte character. In some instances, the first differing byes are the second or subsequent bytes of a multi-byte character. Note also that a Unicode character that is not ASCII may span a pair of blocks. In some instances, the first differing bytes are the initial bytes of Unicode characters, and the remaining bytes are in the next block. A less common case occurs when the first differing byte is at the beginning of a block, the differing byes are part of multi-byte characters, and the differing bytes are not the first bytes of multi-byte characters. In this case, the process has to reconstruct entire characters, even if it means reusing the ending of the block that was just processed.

In some instances, the first differing characters are determined to be equal according to the collation parameters 270, even if the characters are not identical (e.g., two accented characters involved in an accent-insensitive collation). In this case, the process proceeds to find the next differing character (if any).

Like the other lookup tables, the fast sort weight table 262 depends on both the language and the strength parameters 270.

FIG. 8 provides a process flow for efficient collation of text strings. The process begins by receiving (802) two text string S and T, each having Unicode encoding. In some implementations, the strings are encoded using UTF-8. A scan through the strings (either by individual character or by blocks) determines (804) whether the two text strings are literally identical. If the strings are literally identical, the two strings are designated (806) as equal. If there are any differing bytes, the process identifies (808) the position p of the first differing bytes (from the start of the string, on the left). The process then identifies (810) the characters $s_p$ and $t_p$ in the two text strings that contain the first differing bytes. The simple case is when the characters are ASCII characters. However, the differing bytes may be part of multi-byte Unicode characters. As explained with respect to block processing in FIG. 7, the additional byes needed to complete the Unicode characters may be later in the string (to the right) or earlier in the string (on the left), and the additional bytes are not necessarily in the same block. Note that with UTF-8, it is easy to distinguish between an initial byte of a multi-byte character (the leading two bits are "11") and a subsequent byte of a multi-byte character (the leading two bits are "10").

The process then determines (812) whether both $s_p$ and $t_p$ are in the Fast Sort Weight table 262. If at least one of characters $s_p$ or $t_p$ is missing from the fast sort weight table 262, the process applies (822) the standard Unicode method to compute weights for the suffixes of the string S and T. Because all of the string positions less than p have the same bytes in both S and T, the Unicode process begins at the first differing character.

If both $s_p$ and $t_p$ are in the Fast Sort Weight table 262, the process reads (814) the weight $v_p$ for the character $s_p$ and reads the weight $w_p$ for the character $t_p$. The process then compares (816) these two weights. In many cases, the weights $v_p$ and $w_p$ are different, in which case the ordering of these two weights determines (818) the collation order of the two strings. If the two weights are equal, the process iterates (820) the same process shown in FIG. 8 using the suffixes of the two strings S and T. The suffixes begin at one character position beyond the position p.

Figure 11A:
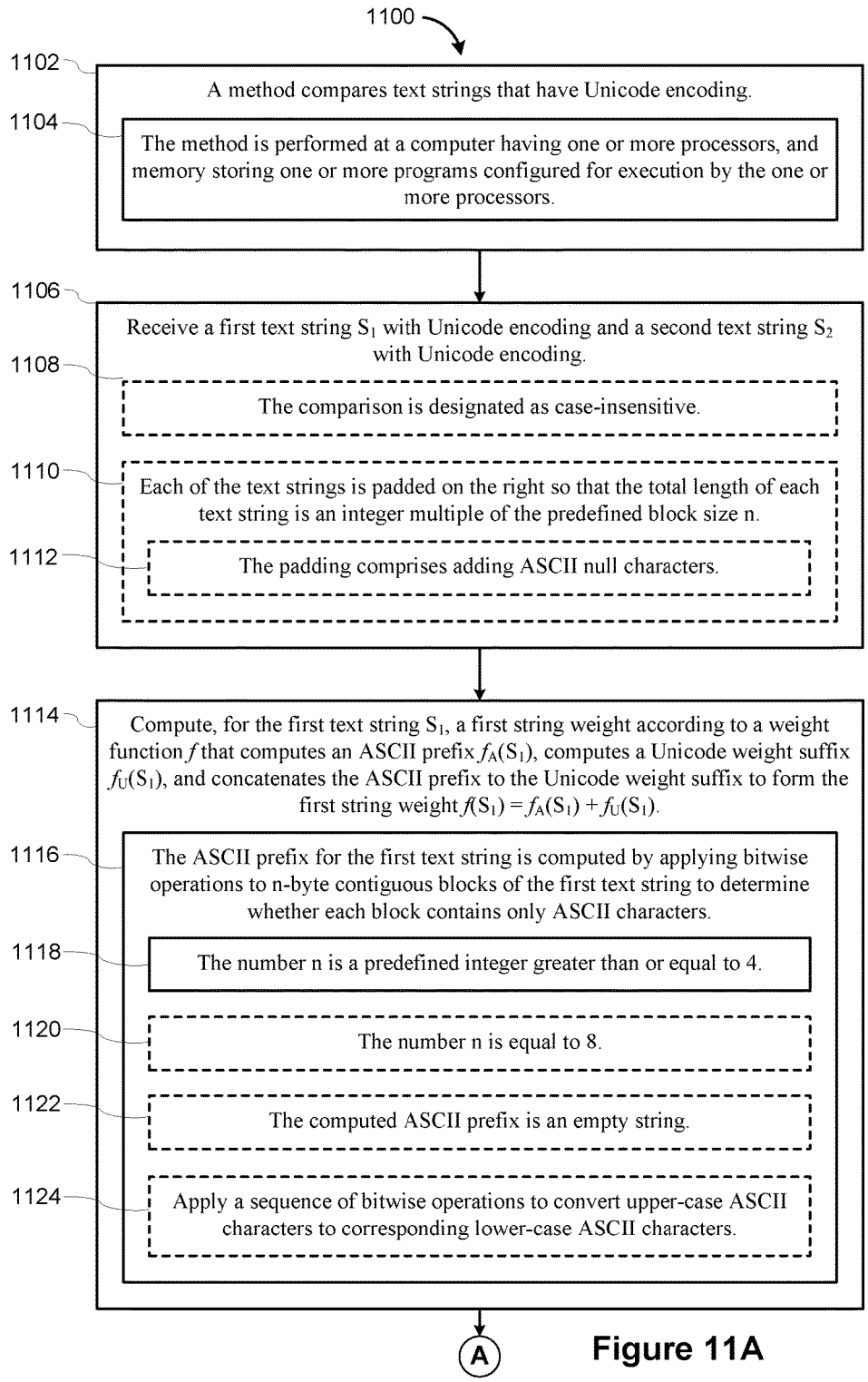
FIGS. 11A-11C provide a flowchart of a process for comparing text strings according to some implementations.
Figure 11B:
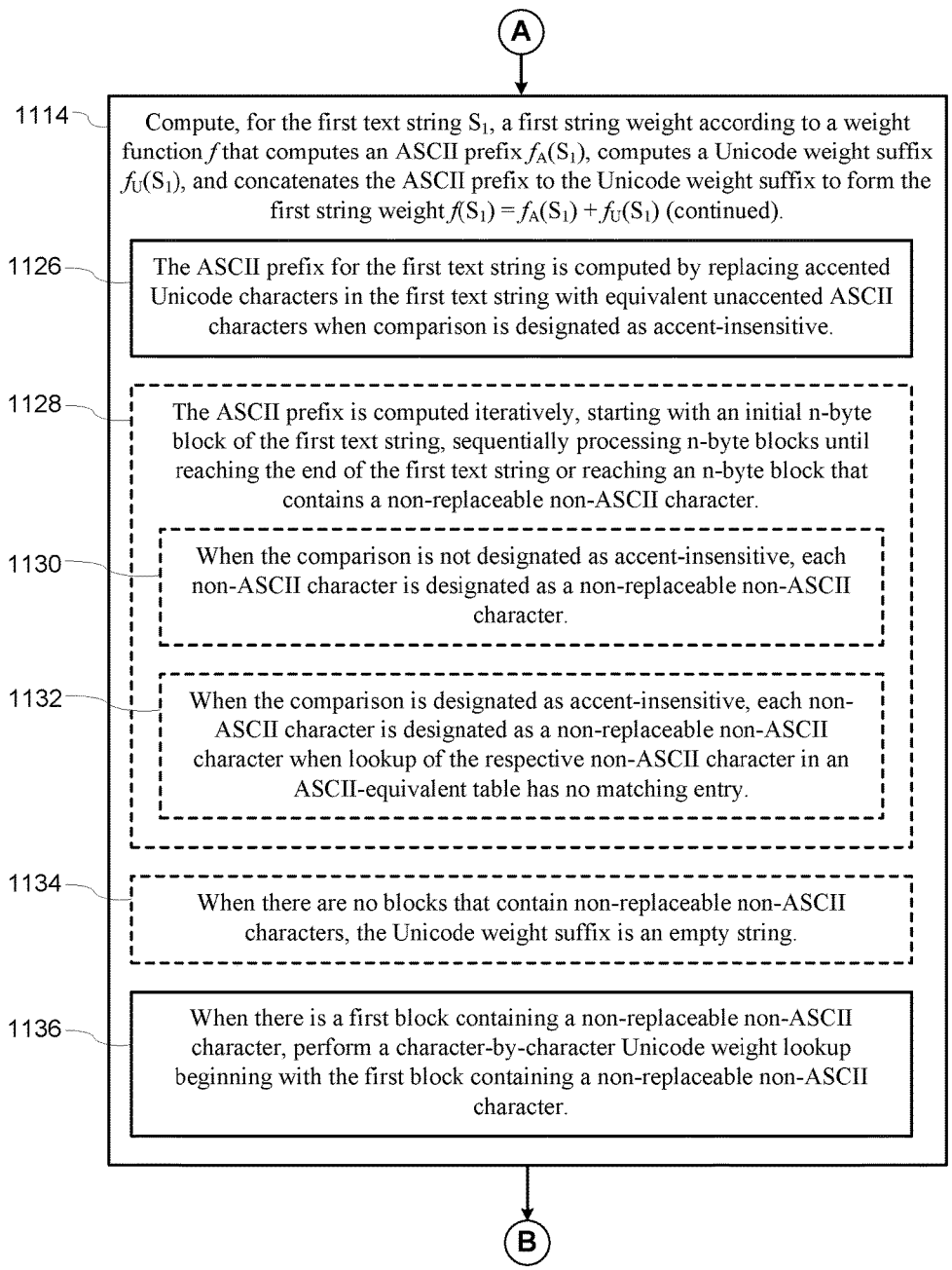
Figure 11C:
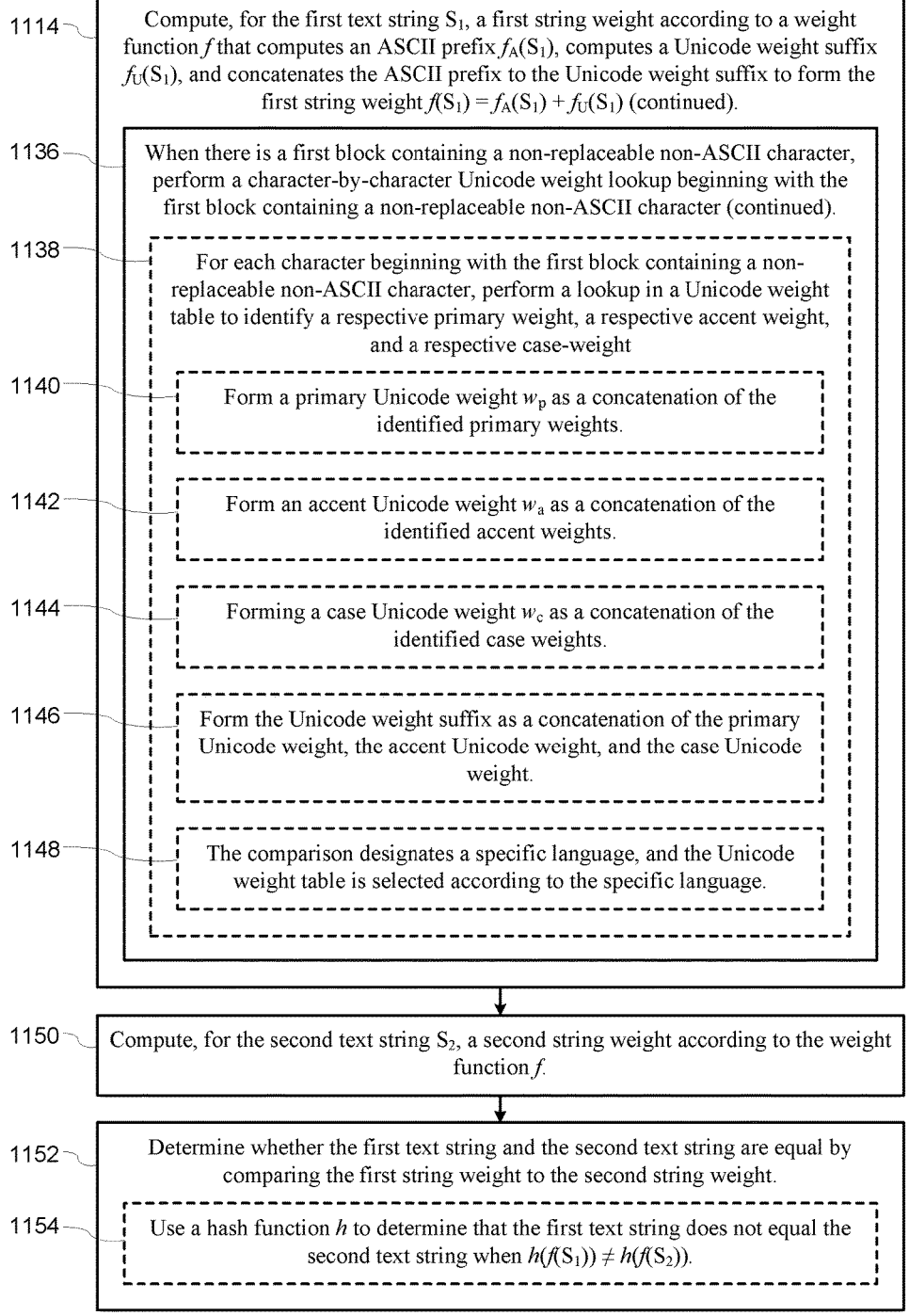

FIGS. 11A-11C provide a flowchart of a process 1100 for comparing text strings. In particular, two text strings may be deemed equal for purposes of a comparison even if the strings are not identical. In many cases, the comparison occurs in multiple phases. For example, a database engine may perform a hash join between two tables, and the join is based on a text column. Part of the process builds a hash table for one side of the join. To build the hash table, a weight is computed for each join key value, and a hash function is applied to the weight. For the second side of the join, weights are also computed, and the hash values of these weights are compared against the hash values in the hash table. In this way, a first text string (a key value from a first table) is compared against a second text string (a key value from a second table).

The process 1100 compares (1102) text strings that have Unicode encoding. Typically, the encoding uses UTF-8. The process is performed (1104) at a computing device having one or more processors and memory. The memory stores (1104) one or more programs configured for execution by the one or more processors.

The process receives (1106) a first text string $S_1$ and a second text string $S_2$, both with Unicode encoding. As noted above, these two text strings may be received at substantially the same time or at different times. In some instances, one or both of the text strings include non-ASCII characters, but in many cases the text strings consist entirely of ASCII characters (0x00-0x7F). Each comparison has a designated set of comparison parameters 270. In some implementations, the comparison parameters specify a comparison language, whether the comparison is case-sensitive, and whether the comparison is accent-sensitive. In some instances, the comparison is designated (1108) as case-insensitive. In some instances, the comparison is designated as accent-insensitive. The processing is performed on blocks of bytes at a time according to a predetermined block size n. In some implementations, the block size is 8 (e.g., for a 64-bit processor). When the number of bytes in a received text string is not an integer multiple of n, some implementations pad (1110) the text string to make the total length an integer multiple of n. Typically, the character used for padding is (1112) ASCII Null (i.e., 0x00, which is sometimes written as \0).

The process 1100 computes (1114) a first string weight according to a weight function $f$ which computes an ASCII prefix $f_A(S_1)$, computes a Unicode weight suffix $f_U(S_1)$, and concatenates the ASCII prefix to the Unicode weight suffix to form the first string weight $f(S_1)=f_A(S_1)+f_U(S_1)$. This is illustrated above in FIGS. 4-6. The ASCII prefix 622 for the first text string is computed (1116) by applying bitwise operations to n-byte contiguous blocks of the first text string to determine whether each block contains only ASCII characters. This is illustrated by the routines in FIGS. 9A, 9B, and 9C. The block size is (1118) a predefined integer greater than or equal to 4. With current 64-bit processors, the block size is (1120) typically 8 bytes. With older 32-bit processors, some implementations use 4-byte blocks. Some implementations use 16-byte blocks, and this is expected to become more common as 128-bit processors become more available. In some instances, the computed ASCII prefix is (1122) an empty string (a string of length 0). Note that an empty string is not identical to a string containing one or more ASCII null characters, although they may be considered equivalent in a comparison. Some implementations apply (1124) a sequence of bitwise operations to convert uppercase ASCII characters to lowercase ASCII characters (or vice versa). This is illustrated in FIG. 6, and may be performed by the routine in FIG. 10.

When the comparison parameters 270 specify accent-insensitivity, the ASCII prefix 622 for the first text string is computed (1126) by replacing accented Unicode characters in the first text string with equivalent unaccented ASCII characters. This is illustrated in FIG. 5 above. Note that the first text string may not include any accented Unicode characters (the most common case). In addition, the first text string may include one or more Unicode characters that cannot be replaced.

As illustrated in FIGS. 4-6 above, some implementations compute (1128) the ASCII prefix 622 iteratively, starting with an initial n-byte block of the first string, sequentially processing n-type blocks until reaching the end of the first text string or reaching an n-byte block that contains a non-replaceable non-ASCII character. If the iterative process for the ASCII prefix reaches the end of the first text string, the Unicode weight suffix 624 is empty, and the ASCII prefix is the computed weight for the first text string. In some implementations, when the comparison is not designated as accent-insensitive (i.e., the comparison is accent-sensitive), each non-ASCII character is designated (1130) as a non-replaceable non-ASCII character. On the other hand, when the comparison is designated as accent-insensitive, some implementations identify (1132) each non-ASCII character as non-replaceable when lookup of the respective non-ASCII character in the ASCII Substitution table 260 has no matching entry. In many cases, there are no blocks in the first string that contain non-replaceable non-ASCII characters, so the Unicode Weight suffix 624 is (1134) an empty string.

When there is a first block containing a non-replaceable non-ASCII character, the process 1100 performs (1136) a character-by-character Unicode weight lookup beginning with the first block containing the non-replaceable non-ASCII character. Some implementations use a Unicode Weight table 264 for this process, as illustrated above with respect to FIGS. 3 and 6. In some implementations, the lookup for each character identifies (1138) a respective primary weight, a respective accent weight (also referred to as a secondary weight), and a case weight (also referred to as a tertiary weight). Typically, the comparison designates (1148) a specific language, and the Unicode Weight table 264 is selected (1148) according to the specific language. In some implementations, the primary weight $w_p$ for the Unicode Weight suffix 624 is (1140) the concatenation of the primary weights of the individual characters. In some implementations, the accent weight $w_a$ for the Unicode Weight suffix 624 is (1142) the concatenation of the accent weights of the individual characters. In some implementations, the case weight $w_c$ for the Unicode Weight suffix 624 is (1144) the concatenation of the case weights of the individual characters. The final Unicode weight suffix 624 is formed (1146) as the concatenation $w_p+w_a+w_c$ of the primary Unicode weight, the accent Unicode weight, and the case Unicode weight.

The process 1100 also computes (1150) a weight for the second text string $S_2$, which applies the same weight function $f$ used to compute the weight of the first string $S_1$.

The process 1100 determines (1152) whether the first string $S_1$ and the second string $S_2$ are equal by comparing the first string weight to the second string weight. Some implementations use (1154) a hash function h as part of the determination. In practice, the vast majority of input text strings are not equal, so a process that quickly identifies the strings that are not equal can improve performance. In this regard, a hash function h is useful. In a small number of cases, two different strings have the same hash value (a hash collision) because the hash function is not injective. Therefore, when hash values are equal, a follow up process must be used to determine whether the two input weights $f(S_1)$ and $f(S_2)$ are actually the same. On the other hand, when $h(f(S_1)) \neq h(f(S_2))$, $f(S_1)$ is definitely not equal to $f(S_2)$.

The terminology used in the description of the various described implementations herein is for the purpose of describing particular implementations only and is not intended to be limiting. As used in the description of the various described implementations and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

The foregoing description, for purpose of explanation, has been described with reference to specific implementations. However, the illustrative discussions above are not intended to be exhaustive or to limit the invention to the precise forms disclosed. Many modifications and variations are possible in view of the above teachings. The implementations were chosen and described in order to best explain the principles of the invention and its practical applications, to thereby enable others skilled in the art to best utilize the invention and various implementations with various modifications as are suited to the particular use contemplated.

What is claimed is:

1. A method of comparing text strings with Unicode encoding, comprising:
   at a computer having one or more processors, and memory storing one or more programs configured for execution by the one or more processors:
   receiving a first text string $S_1$ with Unicode encoding and a second text string $S_2$ with Unicode encoding;
   computing, for the first text string $S_1$, a first string weight according to a weight function $f$ that computes an ASCII prefix $f_A(S_1)$, computes a Unicode weight suffix $f_U(S_1)$, and concatenates the ASCII prefix to the Unicode weight suffix to form the first string weight $f(S_1)=f_A(S_1)+f_U(S_1)$, wherein:
   computing the ASCII prefix for the first text string comprises applying bitwise operations to n-byte contiguous blocks of the first text string to determine whether each block contains only ASCII characters, and replacing accented Unicode characters in the first text string with equivalent unaccented ASCII characters when comparison is designated as accent-insensitive, wherein n is a predefined integer greater than or equal to 4; and
   computing the Unicode weight suffix comprises, when there is a first block containing a non-replaceable non-ASCII character, performing a character-by-character Unicode weight lookup beginning with the first block containing a non-replaceable non-ASCII character;
   computing, for the second text string $S_2$, a second string weight according to the weight function $f$; and
   determining whether the first text string and the second text string are equal by comparing the first string weight to the second string weight.

2. The method of claim 1, wherein the computed ASCII prefix is an empty string.

3. The method of claim 1, wherein the Unicode weight suffix is an empty string.

4. The method of claim 1, wherein comparison is designated as case-insensitive, and computing the ASCII prefix further comprises applying a sequence of bitwise operations to convert upper-case ASCII characters to corresponding lower-case ASCII characters.

5. The method of claim 1, wherein comparing the first text string to the second text string uses a hash function h, and the first text string $S_1$ is determined to be not equal to the second text string $S_2$ when $h(f(S_1)) \neq h(f(S_2))$.

6. The method of claim 1, wherein n=8.

7. The method of claim 1, further comprising padding the first text string on the right so that a total length of the first text string is an integer multiple of n.

8. The method of claim 7, wherein padding the first text string comprises adding ASCII null characters.

9. The method of claim 1, wherein computing the ASCII prefix is performed iteratively, starting with an initial n-byte block of the first text string, sequentially processing n-byte blocks until reaching the end of the first text string or reaching an n-byte block that contains a non-replaceable non-ASCII character.

10. The method of claim 9, wherein, when comparison is not designated as accent-insensitive, each non-ASCII character is designated as a non-replaceable non-ASCII character.

11. The method of claim 9, wherein, when comparison is designated as accent-insensitive, each non-ASCII character is designated as a non-replaceable non-ASCII character when lookup of the respective non-ASCII character in an ASCII-equivalent table has no matching entry.

12. The method of claim 1, wherein computing the Unicode weight suffix comprises:
  for each character beginning with the first block containing a non-replaceable non-ASCII character, performing a lookup in a Unicode weight table to identify a respective primary weight, a respective accent weight, and a respective case-weight;
  forming a primary Unicode weight $w_p$ as a concatenation of the identified primary weights;
  forming an accent Unicode weight $w_a$ as a concatenation of the identified accent weights;
  forming a case Unicode weight $w_c$ as a concatenation of the identified case weights; and
  forming the Unicode weight suffix as a concatenation $w_p+w_a+w_c$ of the primary Unicode weight, the accent Unicode weight, and the case Unicode weight.

13. The method of claim 12, wherein the comparison designates a specific language, and the Unicode weight table is selected according to the specific language.

14. A computing device, comprising:
  one or more processors;
  memory; and
  one or more programs stored in the memory and configured for execution by the one or more processors, the one or more programs comprising instructions for:
    receiving a first text string $S_1$ with Unicode encoding and a second text string $S_2$ with Unicode encoding;
    computing, for the first text string $S_1$, a first string weight according to a weight function $f$ that computes an ASCII prefix $f_A(S_1)$, computes a Unicode weight suffix $f_U(S_1)$, and concatenates the ASCII prefix to the Unicode weight suffix to form the first string weight $f(S_1)=f_A(S_1)+f_U(S_1)$, wherein:
      computing the ASCII prefix for the first text string comprises applying bitwise operations to n-byte contiguous blocks of the first text string to determine whether each block contains only ASCII characters, and replacing accented Unicode characters in the first text string with equivalent unaccented ASCII characters when comparison is designated as accent-insensitive, wherein n is a predefined integer greater than or equal to 4; and
      computing the Unicode weight suffix comprises, when there is a first block containing a non-replaceable non-ASCII character, performing a character-by-character Unicode weight lookup beginning with the first block containing a non-replaceable non-ASCII character;
    computing, for the second text string $S_2$, a second string weight according to the weight function $f$; and
    determining whether the first text string and the second text string are equal by comparing the first string weight to the second string weight.

15. The computing device of claim 14, wherein comparing the first text string to the second text string uses a hash function h, and the first text string $S_1$ is determined to be not equal to the second text string $S_2$ when $h(f(S_1)) \neq h(f(S_2))$.

16. The computing device of claim 14, wherein computing the ASCII prefix is performed iteratively, starting with an initial n-byte block of the first text string, sequentially processing n-byte blocks until reaching the end of the first text string or reaching an n-byte block that contains a non-replaceable non-ASCII character.

17. The computing device of claim 16, wherein, when comparison is designated as accent-insensitive, each non-ASCII character is designated as a non-replaceable non-ASCII character when lookup of the respective non-ASCII character in an ASCII-equivalent table has no matching entry.

18. The computing device of claim 14, wherein computing the Unicode weight suffix comprises:
  for each character beginning with the first block containing a non-replaceable non-ASCII character, performing a lookup in a Unicode weight table to identify a respective primary weight, a respective accent weight, and a respective case-weight;
  forming a primary Unicode weight $w_p$ as a concatenation of the identified primary weights;
  forming an accent Unicode weight $w_a$ as a concatenation of the identified accent weights;
  forming a case Unicode weight $w_c$ as a concatenation of the identified case weights; and
  forming the Unicode weight suffix as a concatenation $w_p+w_a+w_c$ of the primary Unicode weight, the accent Unicode weight, and the case Unicode weight.

19. The computing device of claim 18, wherein the comparison designates a specific language, and the Unicode weight table is selected according to the specific language.

20. A non-transitory computer readable storage medium storing one or more programs configured for execution by a computing device having one or more processors and memory, the one or more programs comprising instructions for:
  receiving a first text string $S_1$ with Unicode encoding and a second text string $S_2$ with Unicode encoding;
  computing, for the first text string $S_1$, a first string weight according to a weight function $f$ that computes an ASCII prefix $f_A(S_1)$, computes a Unicode weight suffix $f_U(S_1)$, and concatenates the ASCII prefix to the Unicode weight suffix to form the first string weight $f(S_1)=f_A(S_1)+f_U(S_1)$, wherein:
    computing the ASCII prefix for the first text string comprises applying bitwise operations to n-byte contiguous blocks of the first text string to determine whether each block contains only ASCII characters, and replacing accented Unicode characters in the first text string with equivalent unaccented ASCII characters when comparison is designated as accent-insensitive, wherein n is a predefined integer greater than or equal to 4; and computing the Unicode weight suffix comprises, when there is a first block containing a non-replaceable non-ASCII character, performing a character-by-character Unicode weight lookup beginning with the first block containing a non-replaceable non-ASCII character;

computing, for the second text string $S_2$, a second string weight according to the weight function $f$; and determining whether the first text string and the second text string are equal by comparing the first string weight to the second string weight.

\* \* \* \* \*